(12) United States Patent
Jindal et al.

(10) Patent No.: US 10,763,091 B2
(45) Date of Patent: Sep. 1, 2020

(54) PHYSICAL VAPOR DEPOSITION CHAMBER PARTICLE REDUCTION APPARATUS AND METHODS

(71) Applicant: Applied Materials, Inc., Santa Clara, CA (US)

(72) Inventors: Vibhu Jindal, Milpitas, CA (US); Sanjay Bhat, Bangalore (IN); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 15/681,022

(22) Filed: Aug. 18, 2017

(65) Prior Publication Data
US 2019/0057849 A1    Feb. 21, 2019

(51) Int. Cl.
| | |
|---|---|
| C23C 14/34 | (2006.01) |
| H01J 37/34 | (2006.01) |
| C23C 14/35 | (2006.01) |
| G03F 1/22 | (2012.01) |
| C23C 14/56 | (2006.01) |
| H01J 37/32 | (2006.01) |

(52) U.S. Cl.
CPC ........ *H01J 37/3458* (2013.01); *C23C 14/345* (2013.01); *C23C 14/3407* (2013.01); *C23C 14/3492* (2013.01); *C23C 14/35* (2013.01); *C23C 14/564* (2013.01); *G03F 1/22* (2013.01); *H01J 37/32651* (2013.01); *H01J 37/32669* (2013.01); *H01J 37/3405* (2013.01)

(58) Field of Classification Search
CPC ...................... H01J 37/32651; H01J 37/32669
See application file for complete search history.

(56) References Cited

U.S. PATENT DOCUMENTS

| | | | |
|---|---|---|---|
| 6,451,176 B1 | 9/2002 | Vernon et al. | |
| 6,743,340 B2 * | 6/2004 | Fu | C23C 14/14 204/192.12 |
| 7,791,005 B2 | 9/2010 | Mize et al. | |
| 2014/0251789 A1 * | 9/2014 | Miller | H01J 37/32651 204/192.12 |

\* cited by examiner

*Primary Examiner* — Jason Berman
(74) *Attorney, Agent, or Firm* — Servilla Whitney LLC

(57) ABSTRACT

Physical vapor deposition processing chambers and methods of processing a substrate such as an EUV mask blank in a physical vapor deposition chamber are disclosed. An electric field and a magnetic field are utilized to deflect particles from a substrate being processed in the chamber.

18 Claims, 8 Drawing Sheets

PHYSICAL VAPOR DEPOSITION CHAMBER PARTICLE REDUCTION APPARATUS AND METHODS

TECHNICAL FIELD

The present disclosure relates generally to substrate processing systems, and more specifically, to physical vapor deposition (PVD) processing systems.

BACKGROUND

Sputtering, alternatively called physical vapor deposition (PVD), has long been used in depositing metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively impact the properties of the final product.

Plasma sputtering may be accomplished using either DC sputtering or RF sputtering. Plasma sputtering typically includes a magnetron positioned at the back of the sputtering target to project a magnetic field into the processing space to increase the density of the plasma and enhance the sputtering rate. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC Power can produce high energy at a sputtering target, and cause a large rise in surface temperature of the sputtering target. The sputtering target is cooled by contacting a target backing plate with cooling fluid. However, it has been determined that such cooling may not be sufficient to capture and remove heat from the target. Remaining heat in the target can result in significant mechanical bowing due to thermal gradient in the sputter material and across backing plate. The mechanical bowing increases as larger size wafers are being processed. This additional size aggravates the tendency of the target to bow/deform under thermal, pressure and gravitational loads. The impacts of bowing may include mechanical stress induced in the target material that can lead to fracture, damage to the target, and changes in distance from a magnet assembly to the face of the target material that can cause changes in the plasma properties (e.g., moving the processing regime out of an optimal or desired processing condition which affects the ability to maintain plasma, sputter/deposition rate, and erosion of the target).

In addition, higher target temperature results in re-sputtering of target material, which causes particle generation and defects on other parts of the PVD chamber and the wafer being processed in the chamber. Furthermore, the deposition on shields starts to crack of flake due to film stress, thermal stress and cohesion issues after certain thickness which causes another source of particle generation. There is need to provide apparatus and methods to efficiently reduce and/or prevent particles from being deposited on the substrate.

SUMMARY

One or more embodiments of the disclosure are directed to a physical vapor deposition chamber. The chamber comprises a chamber wall defining an inner volume within the physical vapor deposition chamber, a backing plate configured to support a sputtering target, the backing plate disposed in an upper section of the inner volume, a substrate support having a support surface to support a substrate below the backing plate, a central region between the backing plate and the substrate support, a process kit including a shield surrounding the central region, the shield comprising a cylindrical body having an inner surface, an upper portion and a lower portion, a first electrode assembly positioned on an inner surface of the shield, and a magnet positioned on the inner surface of the shield. The first electrode assembly is positioned and configured to create an electromagnetic field that laterally displaces particles generated during a physical vapor deposition process and the first electrode assembly and the magnet cooperate to prevent the particles from contacting a substrate on the substrate support during the physical vapor deposition process.

Other embodiments of the disclosure pertain to methods of processing a substrate in a physical vapor deposition chamber. The methods comprise placing a substrate on a substrate support within an inner volume of the physical vapor deposition chamber defined by a chamber wall. The inner volume includes an upper section and a lower section. The substrate support is in the lower section. Material is sputtered from a target of source material located above the substrate support in an upper section. There is a central region between the target of source material and the substrate support and process kit including a shield surrounding the central region. The shield comprises a cylindrical body having an inner surface, an upper portion and a lower portion. A magnet is positioned on an inner surface of the lower portion of the shield. A voltage is applied to a first electrode assembly positioned on an inner surface of the upper portion of the shield to laterally displace particles generated during a physical vapor deposition process and prevent the particles from contacting a substrate on the substrate support during the physical vapor deposition process.

Further embodiments of the disclosure are directed to methods of manufacturing an EUV mask blank in a physical vapor deposition chamber. The method comprises depositing alternating layers of a multilayer reflector material by sputtering material from a target on a substrate in a multicathode physical vapor deposition chamber. The substrate is placed within an inner volume of the physical vapor deposition chamber defined by a chamber wall. The inner volume includes an upper section, a lower section and a central region. The substrate is surrounded by a shield surrounding the central region. The shield has an inner surface, an upper portion and a lower portion. Particles are generated during the sputtering and laterally deflected with an electric field generated at the upper portion of the shield to prevent particles from being deposited on the substrate. A magnetic field is generated at a lower portion of the shield to prevent particles from being deposited on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Those skilled in the art will understand that the use of ordinals such as "first" and "second" to describe process regions do not imply a specific location within the processing chamber, or order of exposure within the processing chamber.

Figure 1:
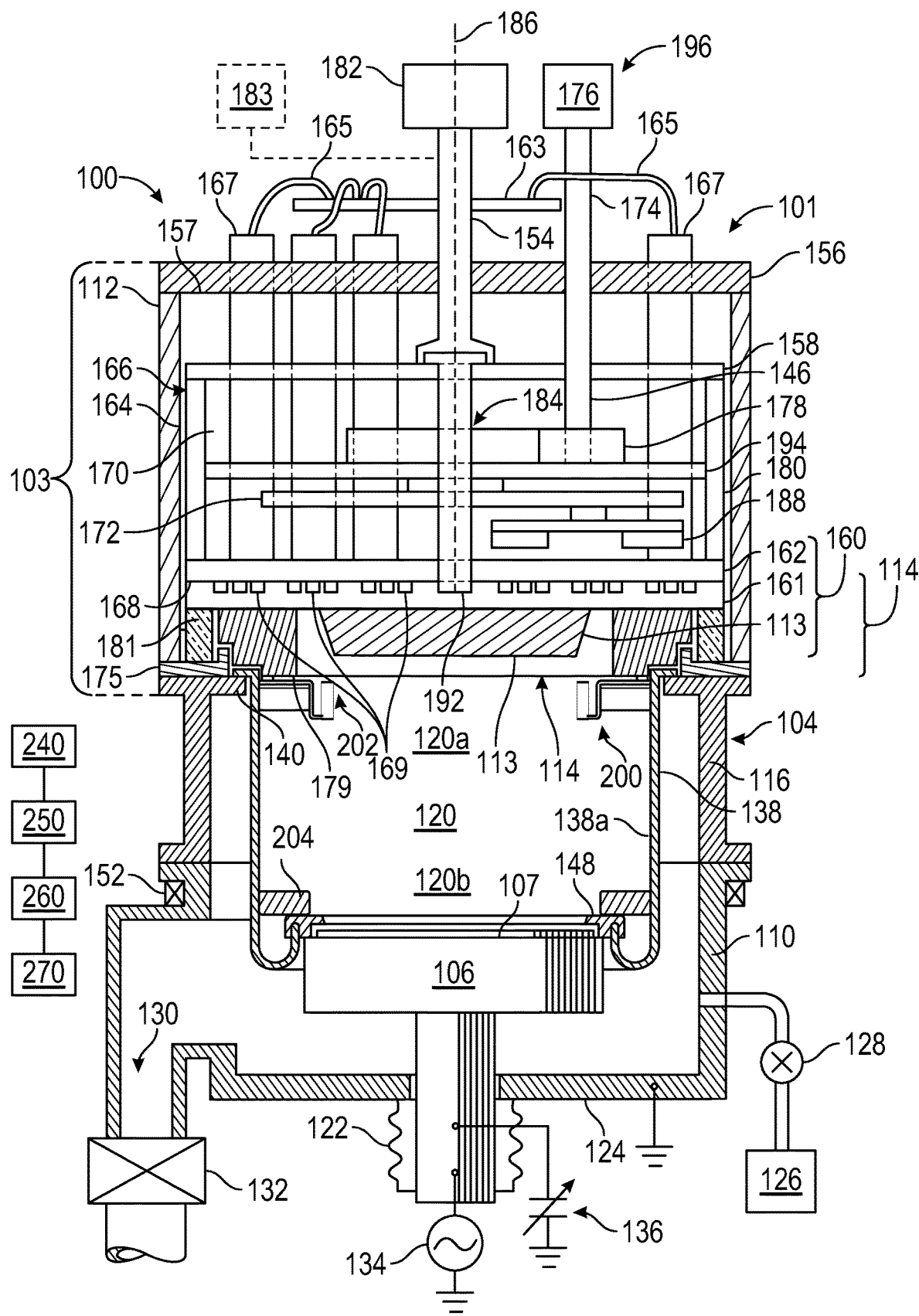
FIG. 1 depicts a schematic cross-sectional view of a process chamber in accordance with some embodiments of the present disclosure.

FIG. 1 depicts a simplified, cross-sectional view of a physical vapor deposition (PVD) processing system 100 in accordance with some embodiments of the present disclosure. Examples of other PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

In some embodiments of the present disclosure, the PVD processing system 100 includes a chamber body 101 removably disposed atop a PVD process chamber 104. The chamber body 101 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber body 101 such that an RF return path is provided to an RF or DC power source 182 disposed above the chamber body 101. The RF or DC power source 182 may provide RF or DC power to the target assembly 114 as discussed below.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield 138 to surround the processing volume, or central region 120 of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber body 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber body 101. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 148 rests on the top of an upwardly extending inner portion of the shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 to selectively provide a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber body 101 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extend from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, the target assembly 114 and optionally, a dark space shield 179.

The seal ring 181 may be a ring or other annular shape having a desired cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The dark space shield 179 is generally disposed about an outer edge of the target assembly 114, such about an outer edge of a source material 113 of the target assembly 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the PVD processing system 100, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target assembly 114. In some embodiments, the support member 175 may be circular, or disc-like in shape, although the shape may vary depending upon the corresponding shape of the chamber lid and/or the shape of the substrate to be processed in the PVD processing system 100. In use, when the chamber body 101 is opened or closed, the support member 175 maintains the dark space shield 179 in proper alignment with respect to the target assembly 114, thereby minimizing the risk of misalignment due to chamber assembly or opening and closing the chamber body 101.

The PVD processing system 100 may include a source distribution plate 158 opposing a backside of the target assembly 114 and electrically coupled to the target assembly 114 along a peripheral edge of the target assembly 114. The target assembly 114 may comprise a source material 113 to be deposited on a substrate, such as the substrate 108 during sputtering, such as a metal, metal oxide, metal alloy, or the like. In one or more embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In one or more embodiments, the backing plate assembly 160 includes a backing plate 161 and a cover plate 162. The backing plate 161 and the cover plate 162 may be disc shaped, rectangular, square, or any other shape that may be accommodated by the PVD processing system 100. A front side of the backing plate is configured to support the source material 113 such that a front surface of the source material opposes the substrate 108 when present. The source material 113 may be coupled to the backing plate 161 in any suitable manner. For example, in some embodiments, the source material 113 may be diffusion bonded to the backing plate 161.

A plurality of channels 169 may be disposed between the backing plate 161 and the cover plate 162. In one or more embodiments, the backing plate 161 may have the plurality of channels 169 formed in a backside of the backing plate 161 with the cover plate 162 providing a cap/cover over each of the channels. In other embodiments, the plurality of channels 169 may be formed partially in the backing plate 161 and partially in the cover plate 162. Still, in other embodiments, the plurality of channels 169 may be formed entirely in the cover plate 162, while the backing plate caps/covers each of the plurality of channels 169. The backing plate 161 and the cover plate 162 may be coupled together.

In some embodiments, the cover plate 162 is eliminated, and the backing plate 161 is a monolithic material. Such a backing plate 161 of monolithic material can be formed by 3D printing, and the plurality of channels 169 are formed during the 3D printing process. In some embodiments, the plurality of channels 169 are configured to flow cooling fluid, and the backing plate 161 and the cover plate 162 are coupled together to form a substantially water tight seal (e.g., a fluid seal between the backing plate 161 and the cover plates 162) to prevent leakage of coolant provided to the plurality of channels 169. That is, the cooling fluid is in direct contact with the channels 169. For example, in some embodiments, the backing plate 161 and the cover plate 162 are brazed together to form a substantially water tight seal or they may be coupled by diffusion bonding, brazing, gluing, pinning, riveting, or any other fastening means to provide a liquid seal, and the channels 169 formed between the backing plate 161 and the cover plate 162 directly contact cooling fluid. However, in other embodiments, the backing plate 161 has the plurality of channels 169 machined therein. The cover plate 162 is then optionally machined (or not machined). Brazing paste is placed between the backing plate 161 and the cover plate 162. Electron beam (E-beam) welding is then utilized to fasten the backing plate 161 and the cover plate 162 together. Thereafter, the fastened components can be heated to complete the fastening process, and then the fastened components may be machined to the final tolerance and specifications. Then the source material in the form of a target can be bonded to the backing plate 161 or cover plate 162 with indium solder. As will be described further below, according to some embodiments of the instant disclosure, a fluid tight seal between the backing plate 161 and the cover plate 162 is not necessary because the cooling fluid is contained within tubing which is disposed within the channels 169.

The backing plate 161 and the cover plate 162 may comprise an electrically conductive material, such as an electrically conductive metal or metal alloy including brass, aluminum, copper, aluminum alloys, copper alloys, or the like. In some embodiments, the backing plate 161 may be a machinable metal or metal alloy (e.g., C18200 chromium copper alloy) such that the channels may be machined or otherwise created on a surface of the backing plate 161. In some embodiments, the cover plate 162 may be a machinable metal or metal alloy, (e.g., C18200 chromium copper alloy) having a stiffness/elastic modulus greater than the metal or metal alloy of the backing plate to provide improved stiffness and lower deformation of backing plate assembly 160. The materials and sizes of the backing plate 161 and the cover plate 162 should be such that the stiffness of the entire backing plate assembly 160 will withstand the vacuum, gravitational, thermal, and other forces exerted on the target assembly 114 during deposition process, without (or with very little) deformation or bowing of the target assembly 114 including the source material 113 (i.e., such that the front surface of source material 113 remains substantially parallel to the top surface of a substrate 108).

In some embodiments, the overall thickness of the target assembly 114 may be between about 20 mm to about 100 mm. For example, the source material 113 may be about 10 to about 15 mm thick and the backing plate assembly may be about 10 to about 30 mm thick. Other thicknesses may also be used.

In some embodiments, the target assembly includes one or more inlets (not shown in FIG. 1) fluidly coupled with the channels 169 or with tubing. The one or more inlets are configured to receive a heat exchange fluid and to provide the heat exchange fluid to the plurality of channels 169 or to the tubing. For example, at least one of the one or more inlets may be a plenum to distribute the heat exchange fluid to the plurality of channels 169 or to tubing. The assembly further includes one or more outlets (not shown in FIG. 1 and discussed in detail below) disposed through the cover plate 162 and fluidly coupled to a corresponding inlet by the plurality of channels 169 or tubing. For example, at least one of the one or more outlets may be a plenum to collect the heat exchange fluid from a plurality of the one or more channels or tubing. In some embodiments, one inlet and one outlet are provided and each set of channels in the plurality of set of channels 169 is fluidly coupled to the one inlet and the one outlet.

The inlets and outlets may be disposed on or near a peripheral edge of the cover plate 162 or backing plate 161. In addition, the inlets and outlets may be disposed on the cover plate 162 such that supply conduits 167 coupled to the one or more inlets, and return conduits coupled to the one or more outlets, do not interfere with the rotation of a magnetron assembly 196 in cavity 170. In other embodiments, the inlets and outlets may be disposed on the backing plate 161 such that supply conduits 167 coupled to the one or more inlets, and return conduits (not shown due to cross section) coupled to the one or more outlets, do not interfere with the rotation of a magnetron assembly 196 in cavity 170. In still other embodiments, the inlets and outlets may be coupled to tubing such that supply conduits 167 coupled to the one or more inlets, and return conduits (not shown due to cross section), coupled to the one or more outlets, do not interfere with the rotation of a magnetron assembly 196 in cavity 170.

In some embodiments, PVD processing system 100 may include one or more supply conduits 167 to supply heat exchange fluid to the backing plate assembly 160. In some embodiments, each inlet may be coupled to a corresponding supply conduit 167. Similarly, each outlet may be coupled to a corresponding return conduit. Supply conduits 167 and return conduits may be made of insulating materials. The fluid supply conduit 167 may include a seal ring (e.g., a compressible o-ring or similar gasket material) to prevent heat exchange fluid leakage between the fluid supply conduit 167 and an inlet. In some embodiments, a top end of supply conduits 167 may be coupled to a fluid distribution manifold 163 disposed on the top surface of the chamber body 101. The fluid distribution manifold 163 may be fluidly coupled to the plurality of fluid supply conduits 167 to supply heat exchange fluid to each of the plurality of fluid supply conduits via supply lines 165. Similarly, a top end of return conduits may be coupled to a return fluid manifold (not shown, but similar to 163) disposed on the top surface of the chamber body 101. The return fluid manifold may be fluidly coupled to the plurality of fluid return conduits to return heat exchange fluid from each of the plurality of fluid return conduits via return lines.

The fluid distribution manifold 163 may be coupled to a heat exchange fluid source (not shown) to provide a heat exchange fluid in the form of a liquid to the backing plate assembly 160. The heat exchange fluid may be any process compatible liquid coolant, such as ethylene glycol, deionized water, a perfluorinated polyether (such as Galden®, available from Solvay S. A.), or the like, or solutions or combinations thereof. In some embodiments, the flow of coolant through the channels 169 or tubing may be about 8 to about 20 gallons per minute, in sum total, although the exact flows will depend upon the configuration of the coolant channels, available coolant pressure, or the like.

A conductive support ring 164, having a central opening, is coupled to a backside of the cover plate 162 along a peripheral edge of the cover plate 162. In some embodiments, in place of separate supply and return conduits, the conductive support ring 164 may include a ring inlet to receive heat exchange fluid from a fluid supply line (not shown). The conductive support ring 164 may include an inlet manifold, disposed within the body of the conductive support ring 164, to distribute the heat exchange fluid to an inlet connected to tubing or the channels 169. The conductive support ring 164 may include an outlet manifold, disposed within the body of the conductive support ring 164, to receive the heat exchange fluid from one or more outlets, and a ring outlet to output the heat exchange fluid from the conductive support ring 164. The conductive support ring 164 and the backing plate assembly 160 may be threaded together, pinned, bolted, or fastened in a process compatible manner to provide a liquid seal between the conductive support ring 164 and the cover plate 162. O-rings or other suitable gasket materials may be provided to facilitate providing a seal between the conductive support ring 164 and the cover plate 162.

In some embodiments, the target assembly 114 may further comprise a central support member 192 to support the target assembly 114 within the chamber body 101. The central support member 192 may be coupled to a center portion of the backing plate 161 and the cover plate 162 and extend perpendicularly away from the backside of the cover plate 162. In some embodiments, a bottom portion of the central support member 192 may be threaded into a central opening in the backing plate 161 and the cover plate 162. In other embodiments, a bottom portion of the central support member 192 may be bolted or clamped to a central portion of the backing plate 161 and the cover plate 162. A top portion of the central support member 192 may be disposed through the source distribution plate 158 and includes a feature which rests on a top surface of the source distribution plate 158 that supports the central support member 192 and target assembly 114.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

The PVD processing system 100 may include a cavity 170 disposed between the backside of the target assembly 114 and the source distribution plate 158. The cavity 170 may at least partially house the magnetron assembly 196 as discussed below. The cavity 170 is at least partially defined by the inner surface of the conductive support ring 164, a target facing surface of the source distribution plate 158, and a source distribution plate facing surface (e.g., backside) of the target assembly 114 (or backing plate assembly 160).

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF or DC power source 182 connected to an electrode 154 (e.g., a RF feed structure). The electrode 154 may pass through the grounding plate 156 and is coupled to the source distribution plate 158. The RF or DC power source 182 may include an RF generator and a matching circuit, for example, to minimize reflected RF energy reflected back to the RF generator during operation. For example, RF energy supplied by the RF or DC power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, the PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF or DC power source 182, to provide RF energy, for example, at a second frequency different than a first frequency of RF energy provided by the RF or DC power source 182. In embodiments where the second energy source 183 is a DC power source, the second energy source may be coupled to target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the PVD processing system 100 (e.g., the electrode 154 may be coupled to the target assembly at a point coincident with a central axis of the target, which is coincident with the central axis 186). The electrode 154, aligned with the central axis 186 of the PVD processing system 100, facilitates applying RF energy from the RF or DC power source 182 to the target assembly 114 in an axisymmetrical manner (e.g., the electrode 154 may couple RF energy to the target at a single point aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the chamber body 101. In some embodiments, the magnetron assembly 196 may include a motor 176, a motor shaft 174, a gear box 178, a gear box shaft assembly 184, and a rotatable magnet (e.g., a plurality of magnets 188 coupled to a magnet support member 172), and divider 194. In some embodiments, the magnetron assembly 196 remains stationary.

In some embodiments, the magnetron assembly 196 is rotated within the cavity 170. For example, in some embodiments, the motor 176, motor shaft 174, gear box 178, and gear box shaft assembly 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. In one or more embodiments, the electrode 154 is aligned with the central axis 186 of the PVD chamber. As such, in some embodiments, the motor shaft 174 of the magnetron may be disposed through an off-center opening in the ground plate 156. The end of the motor shaft 174 protruding from the ground plate 156 is coupled to a motor 176. The motor shaft 174 is further disposed through a corresponding off-center opening through the source distribution plate 158 (e.g., a first opening 146) and coupled to a gear box 178. In some embodiments, one or more second openings (not shown) may be disposed through the source distribution plate 158 in a symmetrical relationship to the first opening 146 to advantageously maintain axisymmetric RF distribution along the source distribution plate 158. The one or more second openings may also be used to allow access to the cavity 170 for items such as optical sensors or the like. In one or more embodiments, the backing plate assemblies described herein are particularly useful in multi-cathode PVD systems with rotating magnets. Prior art designs with larger cooling cavities limited the ability to utilize rotating magnets The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer (not shown) between the gear box 178 and the source distribution plate 158, or the like, or by constructing the motor shaft 174 out of a suitable dielectric material. The gear box 178 is further coupled to the magnet support member 172 via the gear box shaft assembly 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

Still referring to FIG. 1 and also referring to FIGS. 2-8, the physical vapor deposition (PVD) chamber 104 comprises the chamber wall defining an inner volume within the physical vapor deposition chamber 104, the backing plate 161 configured to support a sputtering target 114, the backing plate 161 disposed in an upper section 120a of the inner volume closer to the target 114. The PVD chamber 104 further comprises a substrate support 106 in a lower section 120b of the inner volume having a support surface 107 to support a substrate (not shown) below the backing plate 161. There is a central region 120 between the backing plate 161 and the substrate support 106. The PVD chamber further comprises process kit including the shield 138 surrounding the central region 120, the shield comprising a cylindrical body having an inner surface, an upper portion closer to the backing plate 161 and a lower portion closer to the substrate support 106. The PVD chamber 104 further comprises a first electrode assembly 200 positioned on an inner surface 138a of the shield 138 and a magnet 204 positioned on the inner surface 138a of the shield 138, the first electrode assembly 200 positioned and configured to laterally displace particles generated during a physical vapor deposition process and the first electrode assembly 200 and the magnet 204 cooperate to prevent the particles from contacting a substrate on the substrate support 106 during the physical vapor deposition process.

Figure 2:
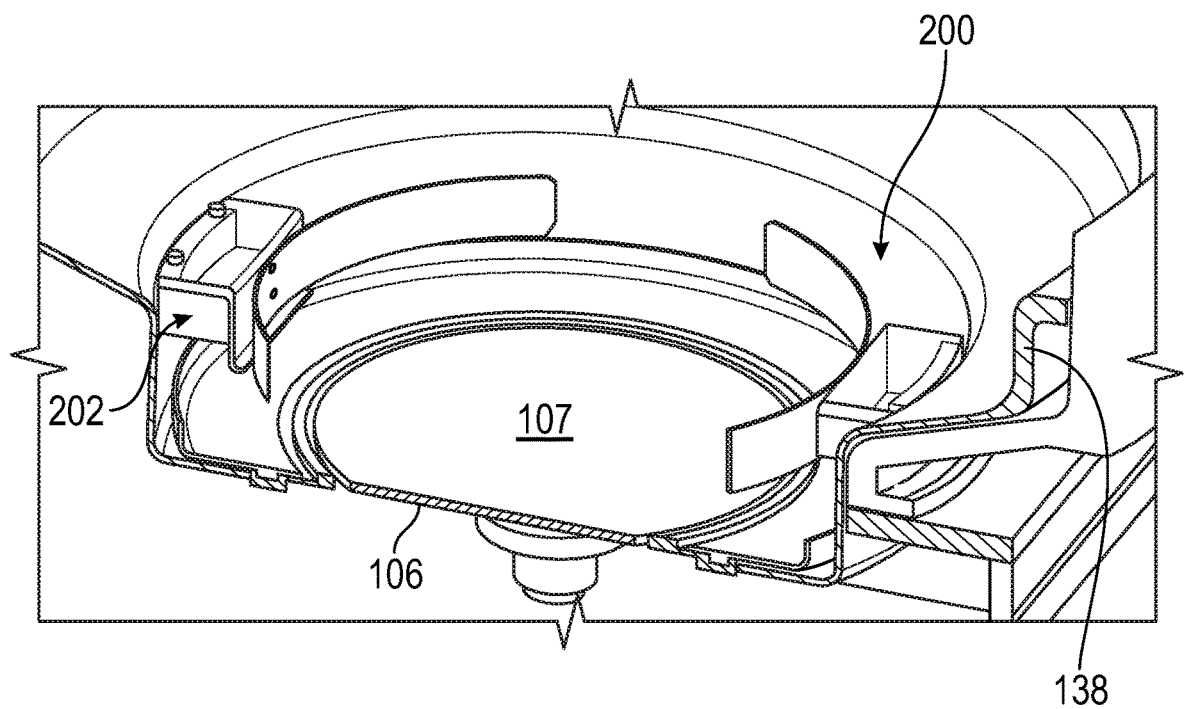
FIG. 2 illustrates a partial cross-sectional view a process chamber including a pair of electrodes in accordance with some embodiments of the present disclosure.
Figure 3:
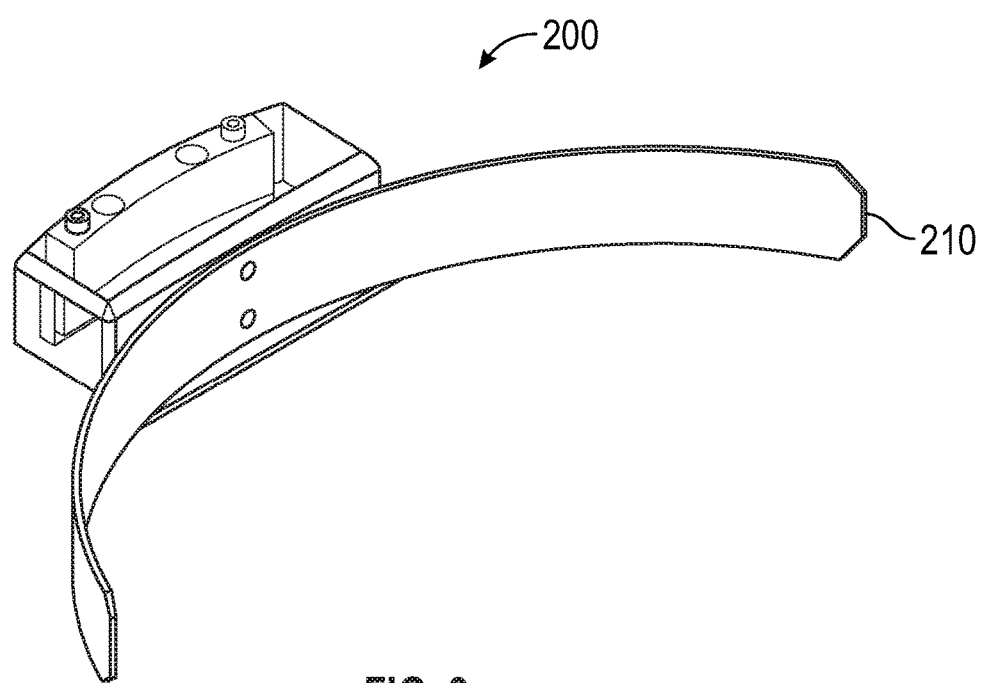
FIG. 3 illustrates a perspective view of an electrode assembly in accordance with some embodiments of the present disclosure.
Figure 4:
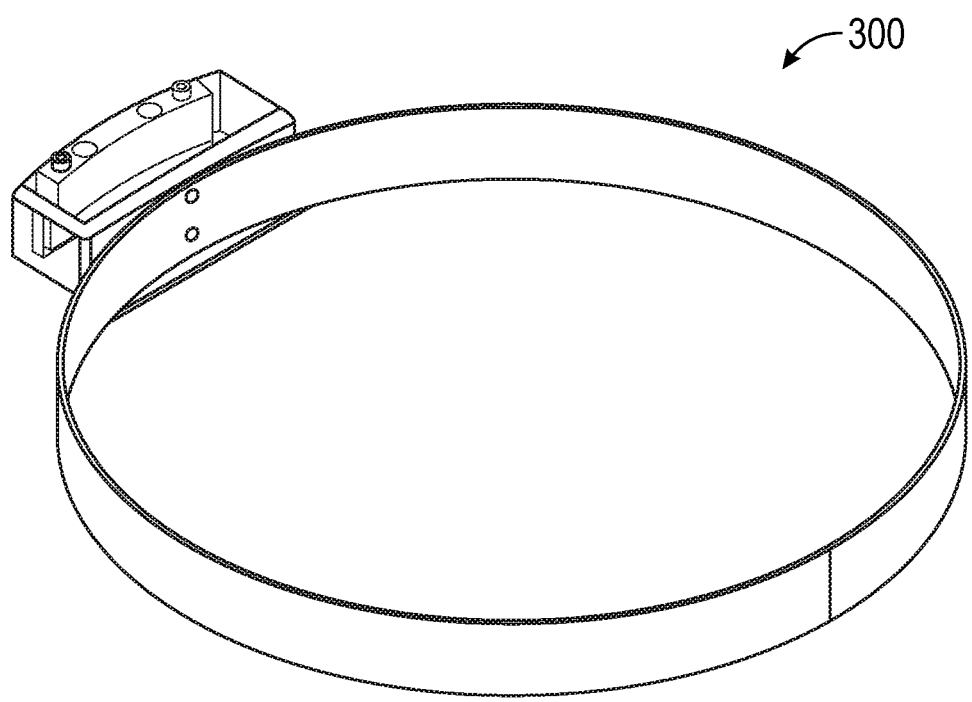
FIG. 4 illustrates a perspective view of an electrode assembly in accordance with some embodiments of the present disclosure.
Figure 8:
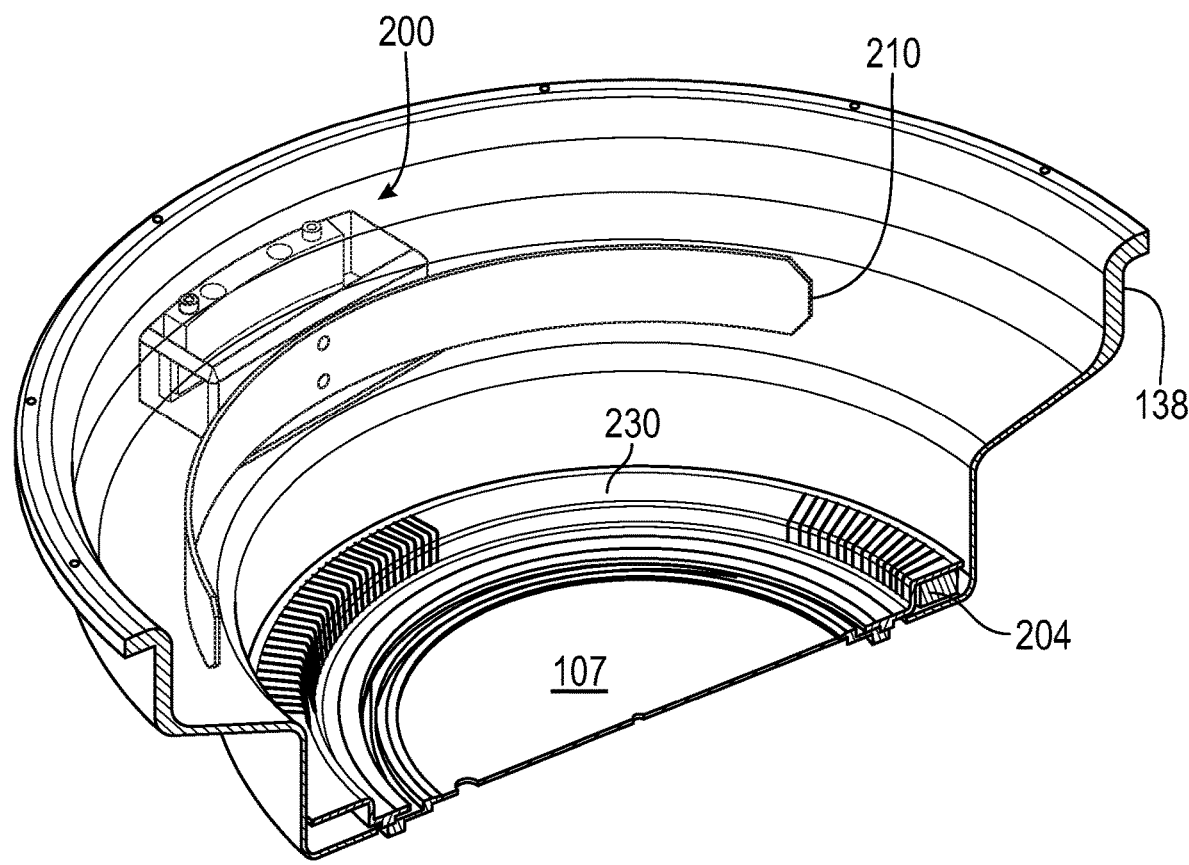
FIG. 8 is a partial perspective view of a shield, an electrode assembly and magnet in accordance with some embodiments of the present disclosure.

In some embodiments, the magnet 204 is positioned at the lower portion of the shield 138 and the first electrode assembly 200 is positioned at the upper portion of the shield 138, as shown in FIG. 1 and FIG. 8. The PVD chamber may further comprising a second electrode assembly 202 positioned on an inner surface and at the upper portion of the shield and a power supply 240 to supply a voltage to the first electrode assembly and the second electrode assembly. In some embodiments, the first electrode assembly 200 and the second electrode assembly 202 are arc-shaped, as shown in FIG. 2. However, the shape of the electrode of the electrode assembly can be other shapes such as the electrode assembly 300 shown in FIG. 4 with a circular shape.

Figure 5A:
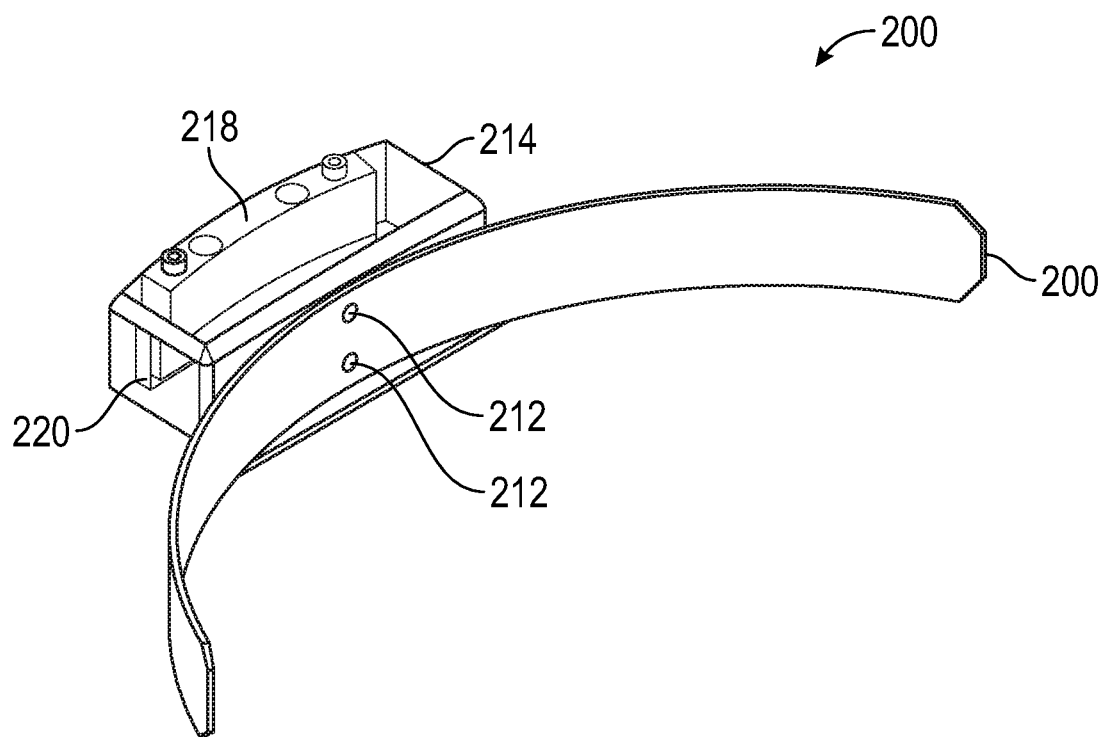
FIG. 5A illustrates a perspective view of an electrode assembly in accordance with some embodiments of the present disclosure.
Figure 5B:
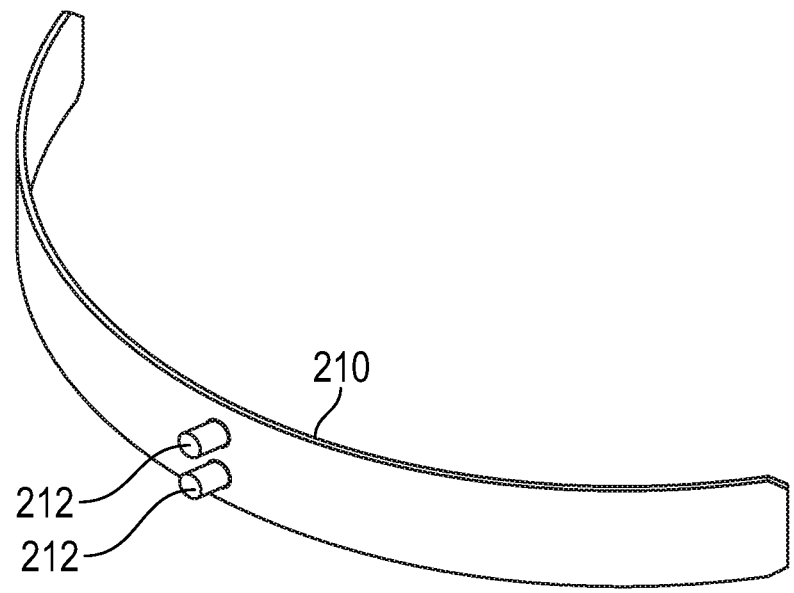
FIG. 5B illustrates a perspective view of a portion of an electrode assembly in accordance with some embodiments of the present disclosure.
Figure 5C:
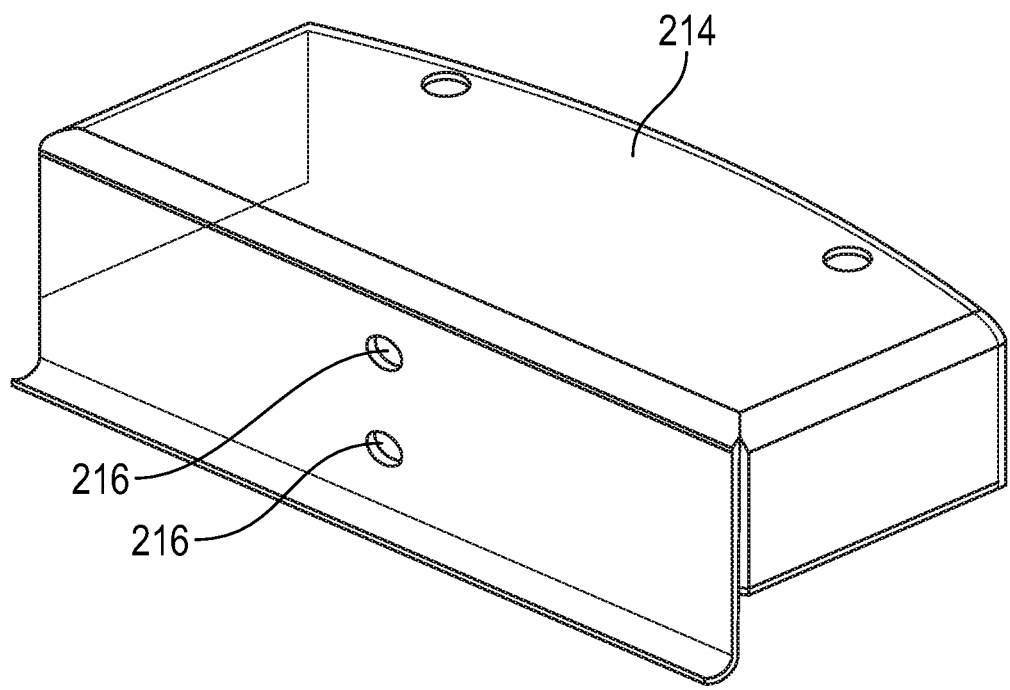
FIG. 5C illustrates a perspective view of a portion of an electrode assembly in accordance with some embodiments of the present disclosure.
Figure 5D:
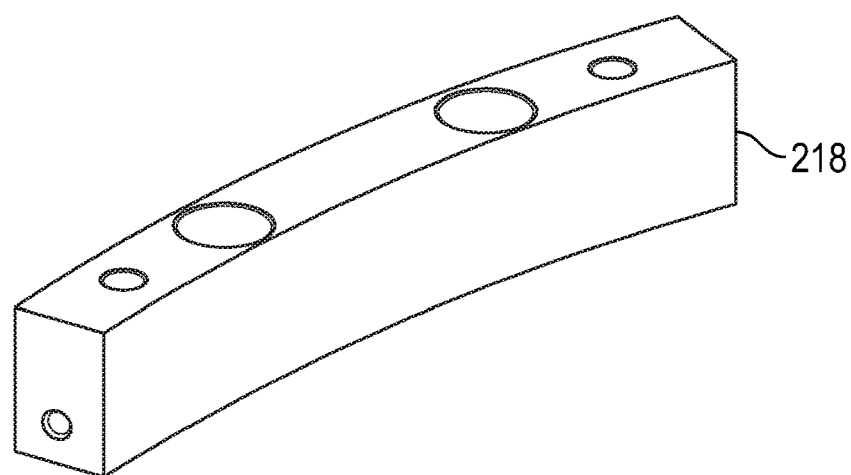
FIG. 5D illustrates a perspective view of a portion of an electrode assembly in accordance with some embodiments of the present disclosure.
Figure 5E:
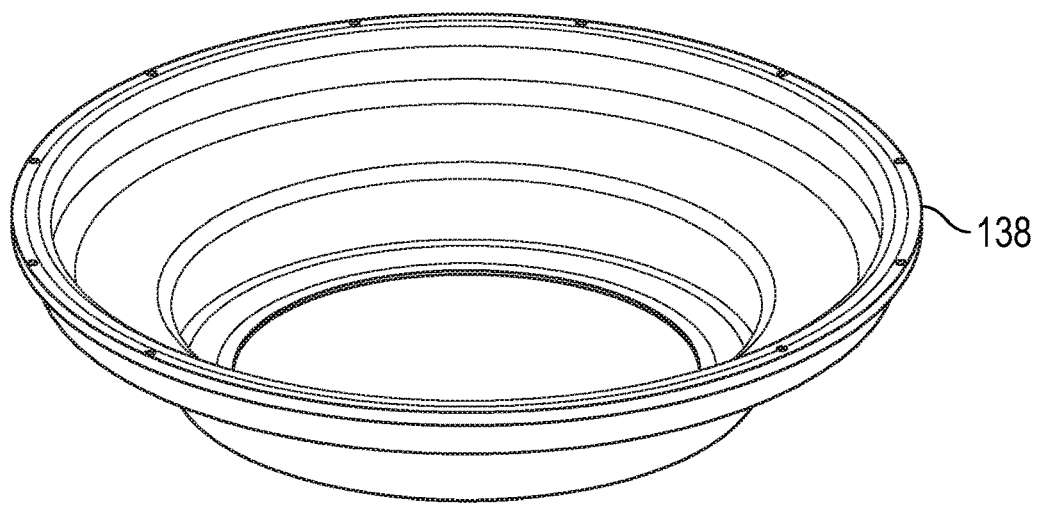
FIG. 5E illustrates a perspective view of a modified shield in accordance with some embodiments of the present disclosure.
Figure 5F:
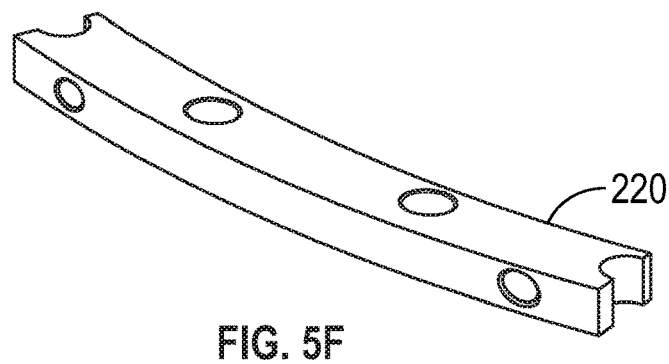
FIG. 5F illustrates a perspective view of a portion of an electrode assembly in accordance with some embodiments of the present disclosure.

As shown in FIGS. 5A-5F, the electrode assembly 200 (and the electrode assembly 202) may comprise an arc-shaped electrode 210 as shown in FIG. 5B, including mounting studs 212. The electrode assembly 200 (and the electrode assembly 202) can further comprise a main electrode body 214 including mounting holes 216 to permit mounting of the electrode 210 by mounting studs 212. The electrode assembly 200 (and the electrode assembly 202) can further comprise a terminal 218 that fits within the main electrode body 214, and an insulator 220 that fits within the main electrode body 214. The electrode assembly can be mounted in the shield 218 shown in FIG. 5E.

Figure 6:
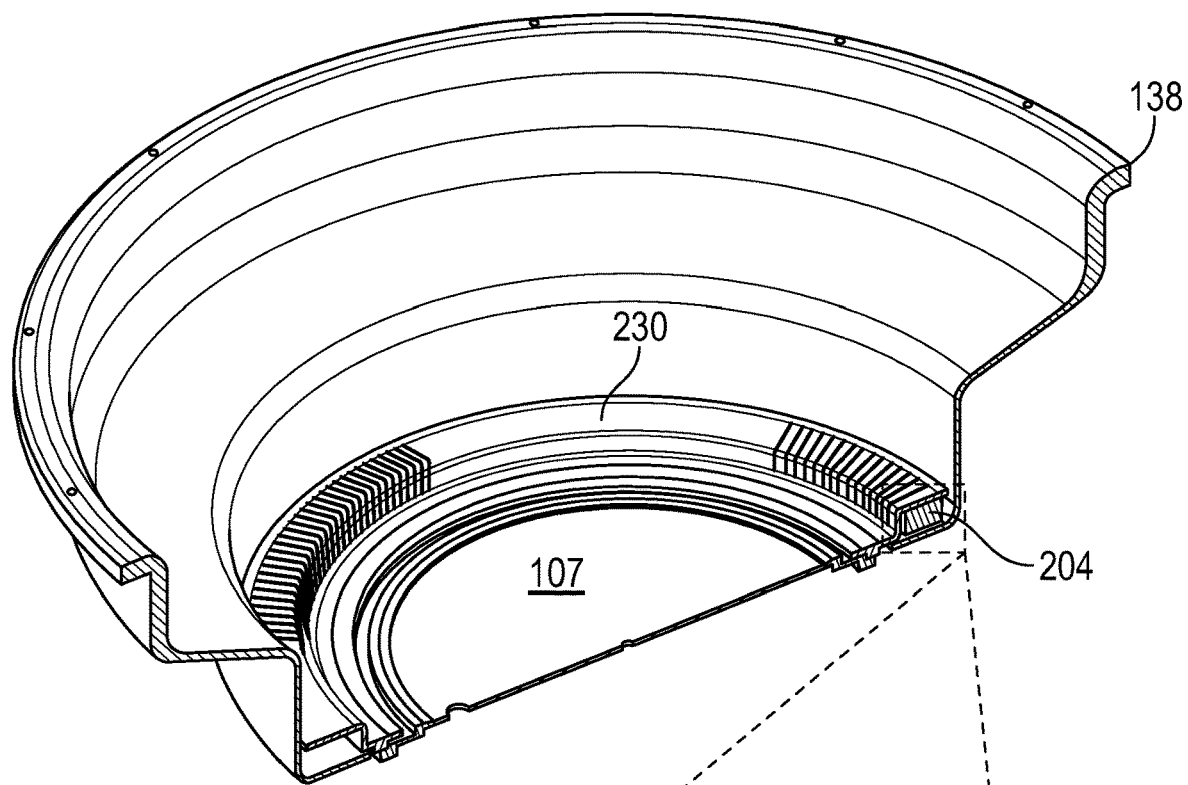
FIG. 6 a partial perspective view of a shield and a magnet in accordance with some embodiments of the present disclosure.
Figure 7:
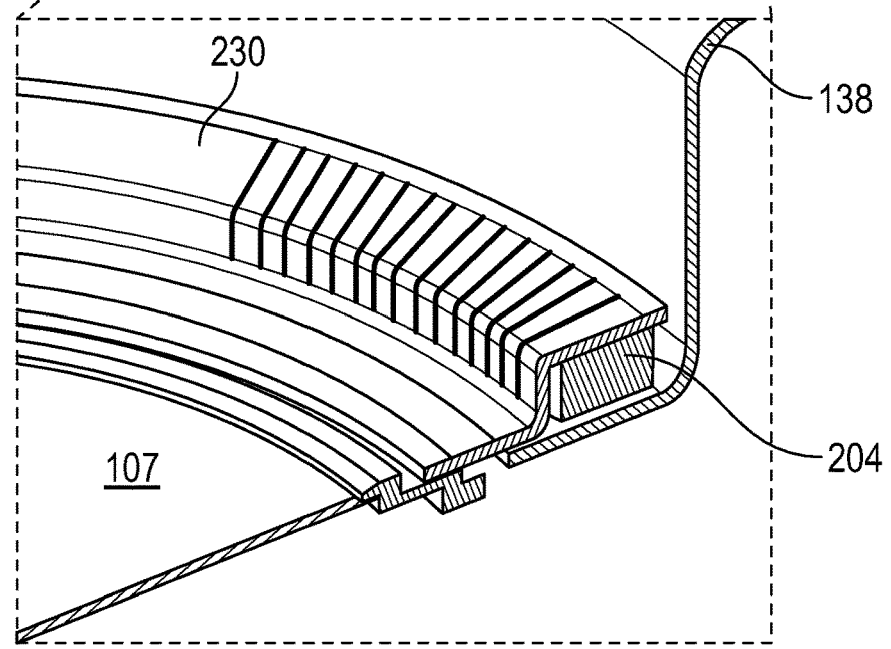
FIG. 7 is an exploded perspective view of a portion of FIG. 6.

In one or more embodiments, the PVD chamber further comprises a controller 250 configured to selectively apply predetermined voltage differences between the first electrode assembly 200 and the second electrode assembly 202 that create the electric field that laterally displace particles generated during the physical vapor deposition process. In some embodiments the magnet 204 comprises a static magnet. In some embodiments, the magnet 204 comprises an electromagnet, and the physical vapor deposition chamber comprises a second power supply 260 and a second controller 270 that selectively applies current such that that the electromagnet creates a magnetic field that deflects particles generated during the physical vapor deposition process away from the substrate support. As best shown in FIGS. 6-8, the PVD chamber further comprises a magnet cover 230 which covers the magnet 204, which may be an electromagnet. In one or more embodiments, the cover 230 is made from a non-magnetic material such as aluminum. According to one or more embodiments, the height of the first electrode 200 and the second electrode 202 can be increased to increase the intensity of electric field that increases towards the upper portion of the chamber. In some embodiments, when a particle enters between two electrodes (first electrode 200, second electrode 202), then gravity and electrostatic force created by the electric field act simultaneously until the particle passes through the gap between two electrodes. The gravity force causes vertical displacement of the particle while electrostatic force results lateral displacement. The electrostatic force required to laterally displace the particle can be determined empirically or by modeling, and the first controller 250 and/or second controller 270 can be used to provide the voltage required to the first and second electrodes and current to the magnet 204.

Another aspect of the disclosure pertains to a method of processing a substrate in a physical vapor deposition chamber, the method comprising placing a substrate on a substrate support within an inner volume of the physical vapor deposition chamber defined by a chamber wall, the inner volume including an upper section and a lower section, the substrate support in the lower section. The method further comprises sputtering material from a target of source material located above the substrate support in an upper section, there being a central region between the target of source material and the substrate support and process kit including a shield surrounding the central region, the shield comprising a cylindrical body having an inner surface, an upper portion and a lower portion, and a magnet positioned on an inner surface of the lower portion of the shield. The method further comprises applying a voltage to a first electrode assembly positioned on an inner surface of the upper portion of the shield to laterally displace particles generated during a physical vapor deposition process and prevent the particles from contacting a substrate on the substrate support during the physical vapor deposition process.

In some embodiment of the method there is a second electrode assembly positioned on an inner surface and at the upper portion of the shield, the method further comprising applying a voltage to the first electrode assembly and the second electrode assembly. In some embodiments, the method further comprises selectively applying predetermined voltage differences between the first electrode assembly and the second electrode assembly to create an electric field that laterally displace particles generated during the physical vapor deposition process. In some embodiments of the method, the magnet comprises an electromagnet, and the method further comprises selectively applying current so the electromagnet so that that the electromagnet generates a magnetic field that deflects particles generated during the physical vapor deposition process away from the substrate support.

Some embodiments of the method further comprise creating a static electromagnetic field or creating a dynamic electromagnetic field. Some embodiments of the method comprise separately tuning the magnetic field and the electric field.

The PVD processing chambers and methods described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer can be formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layer of, for example, molybdenum and silicon can be formed by physical vapor deposition, for example, in a multi-cathode source chamber. An absorbing layer made from a material that absorbs EUV radiation, such as a tantalum-containing material (e.g., TaN or TaON) can also be formed by physical vapor deposition utilizing the chambers and methods described herein.

In some embodiments, a method of manufacturing an EUV mask blank in a physical vapor deposition chamber is provided. The method comprises depositing alternating layers of a multilayer reflector material by sputtering material from a target on a substrate in a multi-cathode physical vapor deposition chamber, the substrate placed within an inner volume of the physical vapor deposition chamber defined by a chamber wall, the inner volume including an upper section, a lower section and a central region, and the substrate surrounded by a shield surrounding the central region, the shield having an inner surface, an upper portion and a lower portion. The method further comprises laterally deflecting particles generated during the sputtering with an electric field generated at the upper portion of the shield to prevent particles from being deposited in the substrate; and generating a magnetic field at a lower portion of the shield to prevent particles from being deposited on the substrate.

In some embodiments, the method further comprises further comprising selectively applying predetermined voltage differences between a first electrode assembly and a second electrode assembly located in the upper portion of the shield to create the electric field. The method may further comprise selectively applying current to an electromagnetic located in the lower portion of the shield to generate the magnetic field. The method may further comprise creating a static electromagnetic field or a dynamic electromagnetic field. The method may further comprise separately tuning the magnetic field and the electric field.

Figure 9:
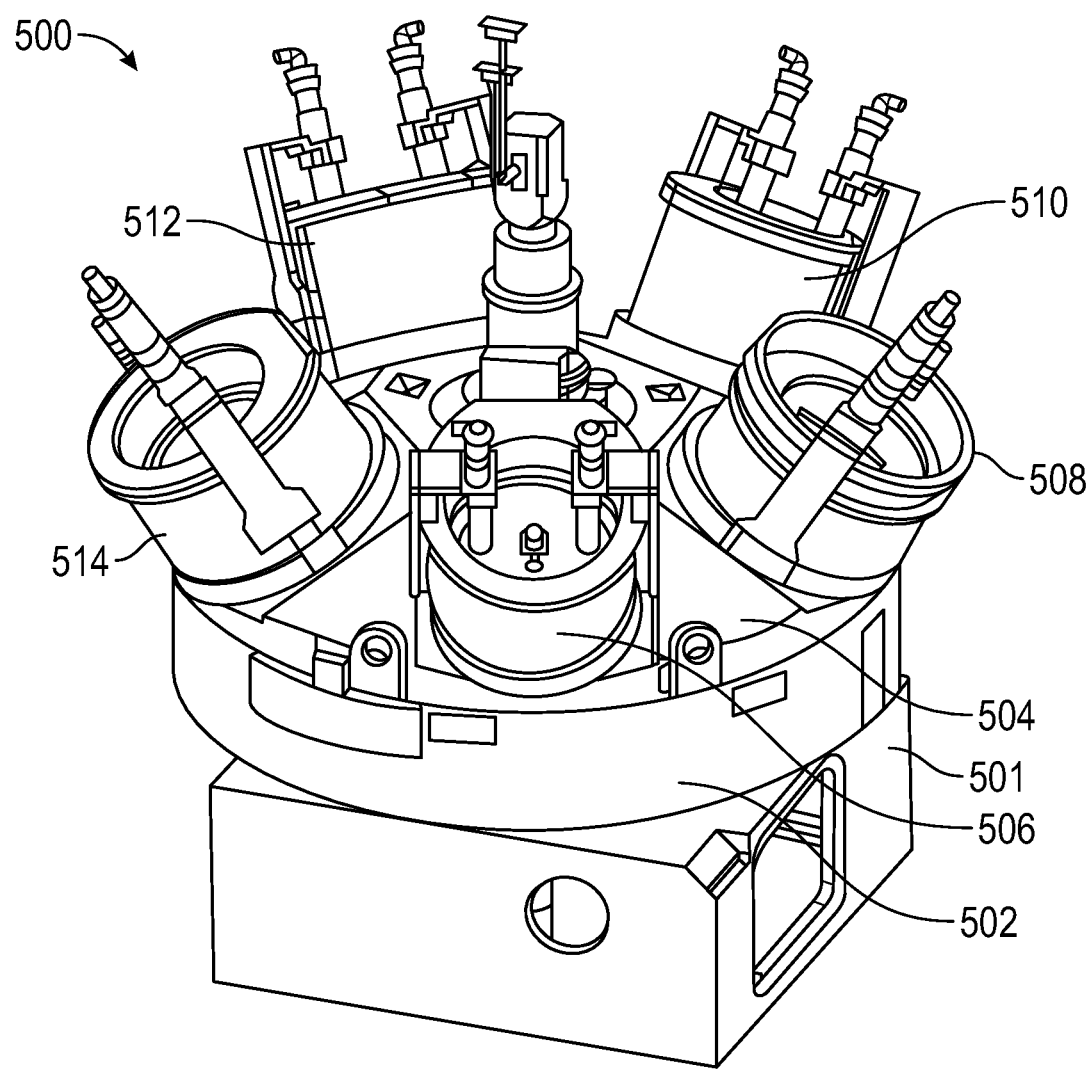
FIG. 9 illustrates a multi-cathode PVD deposition chamber according to an embodiment.

Referring now to FIG. 9, an upper portion of a multi-cathode source chamber 500 is shown in accordance with an embodiment. The multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 504. The PVD processing system 100 described with respect to FIG. 1 can be utilized in the multi-cathode source chamber 500 to form the multilayer stack, as well as capping layers and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

Thus, PVD chambers and methods are provided which can address particles that are generated from the target during interaction with the magnet and plasma. Such charged particles from the target during deposition process can reach the blank substrate and add defects, however, the methods and PVD chambers described herein prevent these charged particles from reaching a substrate during processing. The methods and apparatus can also prevent particles that accumulate on chamber walls or shield surfaces from reaching the substrate and prevent defects. The methods and apparatus can reduce defects during deposition of EUV mask blanks in PVD chambers of multi-cathode PVD systems.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:
1. A physical vapor deposition chamber comprising:
a chamber wall defining an inner volume within the physical vapor deposition chamber;
a backing plate configured to support a sputtering target, the backing plate disposed in an upper section of the inner volume;
a substrate support having a support surface to support a substrate below the backing plate;
a central region between the backing plate and the substrate support;
a process kit including a shield surrounding the central region, the shield comprising a cylindrical body having an inner surface, an upper portion and a lower portion;
a first electrode assembly positioned on an inner surface of the shield and within the central region; and
a magnet positioned on the inner surface of the shield and within the central region, the first electrode assembly positioned and configured to create an electromagnetic field that laterally displaces particles generated during a physical vapor deposition process that cause defects, and the first electrode assembly and the magnet cooperate to prevent the particles that cause defects from contacting a substrate on the substrate support during the physical vapor deposition process.

2. The physical vapor deposition chamber of claim 1, the magnet positioned at the lower portion of the shield and the first electrode assembly positioned at the upper portion of the shield.

3. The physical vapor deposition chamber of claim 2, further comprising a second electrode assembly positioned on an inner surface and at the upper portion of the shield and a power supply to supply a voltage to the first electrode assembly and the second electrode assembly.

4. The physical vapor deposition chamber of claim 3, wherein the first electrode assembly and the second electrode assembly are arc-shaped.

5. The physical vapor deposition chamber of claim 4, further comprising a controller configured to selectively apply predetermined voltage differences between the first electrode assembly and the second electrode assembly to create an electric field that laterally displace particles generated during the physical vapor deposition process.

6. The physical vapor deposition chamber of claim 5, wherein the magnet comprises an electromagnet, the physical vapor deposition chamber comprises a second power supply and a second controller that selectively applies current such that that the electromagnet creates a magnetic field that deflects particles generated during the physical vapor deposition process away from the substrate support.

7. The physical vapor deposition chamber of claim 6, further comprising a magnet cover which covers the electromagnet.

8. A method of processing a substrate in a physical vapor deposition chamber, the method comprising:
   placing a substrate on a substrate support within an inner volume of the physical vapor deposition chamber defined by a chamber wall, the inner volume including an upper section and a lower section, the substrate support in the lower section;
   sputtering material from a target of source material located above the substrate support in an upper section, there being a central region between the target of source material and the substrate support and process kit including a shield surrounding the central region, the shield comprising a cylindrical body having an inner surface, an upper portion and a lower portion, and a magnet positioned on an inner surface of the lower portion of the shield and within the central region; and
   applying a voltage to a first electrode assembly positioned on an inner surface of the upper portion of the shield to laterally displace particles generated during a physical vapor deposition process that cause defects, and the first electrode assembly and the magnet cooperate to prevent the particles that cause defects from contacting a substrate on the substrate support during the physical vapor deposition process.

9. The method of claim 8, wherein there is a second electrode assembly positioned on an inner surface and at the upper portion of the shield, the method further comprising applying a voltage to the first electrode assembly and the second electrode assembly.

10. The method of claim 9, further comprising selectively applying predetermined voltage differences between the first electrode assembly and the second electrode assembly to create an electric field that laterally displace particles generated during the physical vapor deposition process.

11. The method of claim 10, wherein the magnet comprises an electromagnet, and the method further comprises selectively applying current so the electromagnet so that that the electromagnet generates a magnetic field that deflects particles generated during the physical vapor deposition process away from the substrate support.

12. The method of claim 11, further comprising creating a static electromagnetic field.

13. The method of claim 11, further comprising creating a dynamic electromagnetic field.

14. The method of claim 11, further comprising separately tuning the magnetic field and the electric field.

15. The apparatus of claim 1, further comprising a cover ring configured to rest on an upwardly extending inner portion of the shield when the substrate support is in a lower, loading position and to rest on an outer periphery of the substrate support when the substrate support is in an upper, deposition position to protect the substrate support from sputter deposition.

16. The apparatus of claim 15, wherein the magnet is positioned above the cover ring.

17. The method of claim 8, wherein there is a cover ring configured to rest on an upwardly extending inner portion of the shield when the substrate support is in a lower, loading position and to rest on an outer periphery of the substrate support when the substrate support is in an upper, deposition position to protect the substrate support from sputter deposition.

18. The method of claim 17, wherein the magnet is positioned above the cover ring.

* * * * *